(12) United States Patent
Lou et al.

(10) Patent No.: US 12,094,406 B2
(45) Date of Patent: Sep. 17, 2024

(54) DISPLAY PANEL AND DISPLAY APPARATUS

(71) Applicant: KunShan Go-Visionox Opto Electronics Co., Ltd, Jiangsu (CN)

(72) Inventors: Junhui Lou, Kunshan (CN); Yong Wu, Kunshan (CN); Lin Ge, Kunshan (CN); Zeshang He, Kunshan (CN)

(73) Assignee: KunShan Go-Visionox Opto Electronics Co., Ltd, Kunshan (CN)

( * ) Notice: Subject to any disclaimer, the term of this patent is extended or adjusted under 35 U.S.C. 154(b) by 0 days.

(21) Appl. No.: 18/480,073

(22) Filed: Oct. 3, 2023

(65) Prior Publication Data

US 2024/0029648 A1 Jan. 25, 2024

Related U.S. Application Data

(63) Continuation of application No. PCT/CN2022/108270, filed on Jul. 27, 2022.

(30) Foreign Application Priority Data

Feb. 28, 2022 (CN) .......................... 202210191210.8

(51) Int. Cl.
*G09G 3/3225* (2016.01)

(52) U.S. Cl.
CPC ... *G09G 3/3225* (2013.01); *G09G 2300/0426* (2013.01); *G09G 2310/0286* (2013.01); *G09G 2320/0233* (2013.01)

(58) Field of Classification Search
CPC ......... G09G 2300/0426; G09G 3/3233; G09G 2300/0452; G09G 3/3225; G09G 3/3208;
(Continued)

(56) References Cited

U.S. PATENT DOCUMENTS 10,559,604 B2 * 2/2020 Zhan ..................... H01L 27/124
2018/0366066 A1 12/2018 Kim et al.
(Continued)

FOREIGN PATENT DOCUMENTS

CN 107633807 A 1/2018
CN 107993579 A 5/2018
(Continued)

OTHER PUBLICATIONS

International Search Report issued Oct. 31, 2022, in corresponding International Application No. PCT/CN2022/108270, 8 pages.
(Continued)

*Primary Examiner* — Koosha Sharifi-Tafreshi
(74) *Attorney, Agent, or Firm* — Maier & Maier, PLLC

(57) ABSTRACT

A display panel and a display apparatus, in which the display panel include sub-pixels, shift registers, and pixel driving circuits. The sub-pixels include first sub-pixels located in the first display area and second sub-pixels located in the second display area, the first sub-pixels are used for achieving the display of the first display area, and the second sub-pixels are used for achieving the display of the second display area. The shift register is configured to provide a control signal to the scanning line, so as to make the first sub-pixel emit light by controlling the first circuit. The pixel driving circuits include first circuits configured to drive the first sub-pixels, second circuits configured to drive the second sub-pixels, and dummy areas.

20 Claims, 7 Drawing Sheets

(58) Field of Classification Search
CPC ......... G09G 2320/0233; H10K 59/121; H10K 59/131; H10K 59/123; H10K 59/65; H10K 59/1213; H10K 59/12; H10K 59/88; H10K 59/128
See application file for complete search history.

(56) References Cited

U.S. PATENT DOCUMENTS

2020/0135764 A1    4/2020    Ha et al.
2021/0225269 A1    7/2021    Yang et al.

FOREIGN PATENT DOCUMENTS

| | | |
|---|---|---|
| CN | 109410823 A | 3/2019 |
| CN | 110518037 A | 11/2019 |
| CN | 111768713 A | 10/2020 |
| CN | 111916486 A | 11/2020 |
| CN | 112462545 A | 3/2021 |
| CN | 112562518 A | 3/2021 |
| CN | 113571570 A | 10/2021 |
| CN | 114242759 A | 3/2022 |
| CN | 114566532 A | 5/2022 |
| CN | 114582265 A | 6/2022 |

OTHER PUBLICATIONS

Chinese Office Action issued Oct. 18, 2022, in corresponding Chinese Application No. 202210191210.8, 21 pages.
Chinese Reexamination Decision issued May 24, 2023, in corresponding Chinese Application No. 202210191210.8, 2 pages.
Chinese Rejection Decision issued Jan. 19, 2023, in corresponding Chinese Application No. 202210191210.8, 8 pages.

* cited by examiner

DISPLAY PANEL AND DISPLAY APPARATUS

CROSS REFERENCE TO RELATED APPLICATION

This application is a continuation of International Application No. PCT/CN2022/108270, filed on Jul. 27, 2022, which claims priority to Chinese Patent Application No. 202210191210.8 filed on Feb. 28, 2022, both of which are incorporated herein by reference in their entireties.

TECHNICAL FIELD

The present application relates to the field of display, and particularly to a display panel and a display apparatus.

BACKGROUND

With the rapid development of electronic devices, demands of users for the screen-to-body ratio are higher and higher, resulting in that the full-screen display of electronic devices attracts more and more attention in the industry.

Current electronic device, such as a mobile phone, a tablet computer, and other mobile terminal, includes a black border around the display screen, i.e., the size of the frame is large. When viewed from the front of the electronic device, the percentage of the display area in the transparent panel is small and the width of the black border (the narrow frame) is large, which is inconvenient for the user to use. The current narrow frame technology needs to reduce the width of the encapsulation area and the size of the circuit as much as possible, therefore, the reliability and anti-drop capability of the encapsulation and the driving capacity of the circuit are adversely affected, and it becomes more and more difficult to achieve a narrower frame.

SUMMARY

Embodiments of the present application provide a display panel and a display apparatus, aiming to reduce the frame of the display panel and achieve a narrow frame design for the display panel.

Embodiment of a first aspect of the present application provide a display panel including a first display area and a second display area, the display panel including: sub-pixels including first sub-pixels located in the first display area and second sub-pixels located in the second display area; one or more shift registers located in the first display area; and pixel driving circuits located in the second display area and including first circuits configured to drive the first sub-pixels, second circuits configured to drive the second sub-pixels, and dummy areas, herein α adjacent second sub-pixels form a pixel block, the first circuit and α second circuits form a first circuit block, the α second circuits in the first circuit block are configured to drive the α second sub-pixels in a same pixel block, the dummy area and α second circuits form a second circuit block, the α second circuits in the second circuit block are configured to drive the α second sub-pixels in a same pixel block, α is an integer greater than 1, and a relative positional relationship between the first circuit and the second circuits in the first circuit block is the same as a relative positional relationship between the dummy area and the second circuits in the second circuit block.

Embodiments of a second aspect of the present application provide a display apparatus including the display panel according to any of the above embodiments of the first aspect.

The display panel according to the embodiments of the first aspect of the present application includes the sub-pixels, the shift registers, and the pixel driving circuits. The sub-pixels include the first sub-pixels and the second sub-pixels, the first sub-pixels and the shift registers are all located in the first display area, and the first sub-pixels are used for achieving the display of the first display area, that is, the area where the shift register is located can display image, thus the non-display area of the display panel can be reduced, so as to achieve the narrow frame design for the display panel. The pixel driving circuits include the first circuits configured to drive the first sub-pixels and the second circuits configured to drive the second sub-pixels, and the first circuits and the second circuits are all located in the second display area. The first circuits are located in the second display area, that is, the pixel driving circuit for driving the first sub-pixel in the area where the shift register is located is located in the second display area, and space is reserved for the shift register. The relative positional relationship between the first circuit and the second circuits in the first circuit block is the same as the relative positional relationship between the dummy area and the second circuits in the second circuit block, the display uniformity of the second display area can be ensured, and the effect of arranging the first circuit in the second display area on the display effect of the second display area is reduced.

BRIEF DESCRIPTION OF THE DRAWINGS

Other features, objects and advantages of the present application will become more apparent from reading the following detailed description of the non-limiting embodiments with reference to the accompanying drawings, in which the same or similar reference numerals represent the same or similar features, and the accompanying drawings are not drawn to actual scale.

DETAILED DESCRIPTION

Features and exemplary embodiments of various aspects of the present application will be described in detail below. In order to make the objects, technical solutions and advantages of the present application clearer, the present application is further described in detail below with reference to the accompanying drawings and specific embodiments. It should be understood that the specific embodiments described herein are only used to explain the present application, but not to limit the present application. For those skilled in the art, the present application can be implemented without some of these specific details. The following description of the embodiments is only to provide a better understanding of the present application by illustrating examples of the present application.

In an electronic device such as a mobile phone and a tablet computer, photosensitive components such as a front camera, an infrared light sensor, and a proximity light sensor need to be integrated at a side of the display panel. In some embodiments, a light-transmitting display area may be arranged on the electronic device and the photosensitive components may be arranged at the back of the light-transmitting display area, so that a full-screen display can be achieved for the electronic device while ensuring that the photosensitive components operate normally.

The current narrow frame technology needs to reduce the width of the encapsulation area and the size of the circuit as much as possible, therefore, the reliability and anti-drop capability of the encapsulation and the driving capacity of the circuit are adversely affected.

In order to solve the above problems, the embodiments of the present application provide a display panel and a display apparatus, which will be described below with reference to the accompanying drawings.

The embodiments of the present application provide a display panel, which may be an organic light emitting diode (OLED) display panel.

Figure 1:
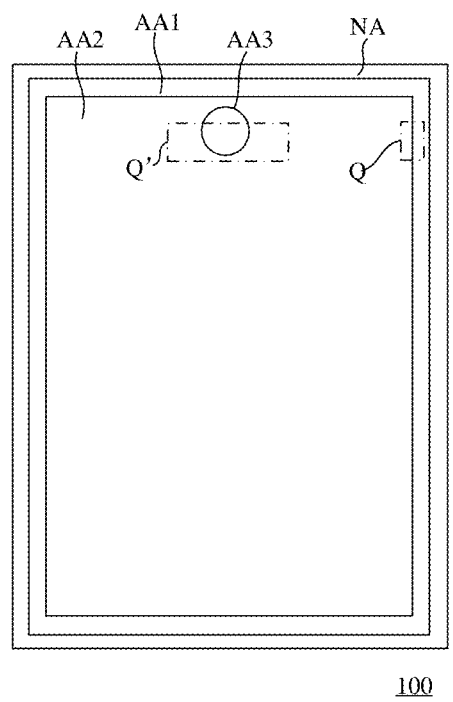
FIG. 1 shows a schematic top view of a display panel according to the embodiments of the first aspect of the present application.

FIG. 1 shows a schematic top view of a display panel according to the embodiments of the first aspect of the present application.

As shown in FIG. 1, the display panel 100 includes a first display area AA1 and a second display area AA2. Optionally, the first display area AA1 is round shaped and arranged around at least a portion of the second display area AA2. The first display area AA1 is the frame display area of the display panel 100.

Optionally, the display panel 100 further includes a third display area AA3, and the second display area AA2 is arranged around at least a portion of the third display area AA3. Optionally, the display panel 100 further includes a non-display area NA surrounding the first display area AA1, the second display area AA2, and the third display area AA3. Optionally, the light transmittance of the third display area AA3 is greater than the light transmittance of the second display area AA2.

Herein, preferably, that the light transmittance of the third display area AA3 is greater than or equal to 15%. In order to ensure that the light transmittance of the third display area AA3 is greater than 15%, or greater than 40%, or even a higher light transmittance, the light transmittances of a part of functional film layers of the display panel 100 in the embodiment are all greater than 80%, or even the light transmittances of at least a part of the functional film layers are greater than 90%.

In the display panel 100 according to the embodiments of the present application, the light transmittance of the third display area AA3 is greater than the light transmittance of the second display area AA2, so that the photosensitive component 200 can be integrated at the back of the first display area AA1 of the display panel 100 to achieve under-screen integration for the photosensitive component 200 such as a camera, while the third display area AA3 can display image, the display area of the display panel 100 is increased, and a full-screen design is achieved for the display apparatus.

The number of the third display area AA3 may be set in a variety of ways, and for example, the number of the third display area AA3 is one and the number of the second display area AA2 is one, so as to achieve the under-screen integration for the photosensitive component 200 or fingerprint recognition. Alternatively, in some other optional embodiments, the number of the third display areas AA3 is two, in which one of the third display areas AA3 is used for the under-screen integration of the photosensitive component 200 and the other one of the third display areas AA3 is used for the fingerprint recognition.

Figure 2:
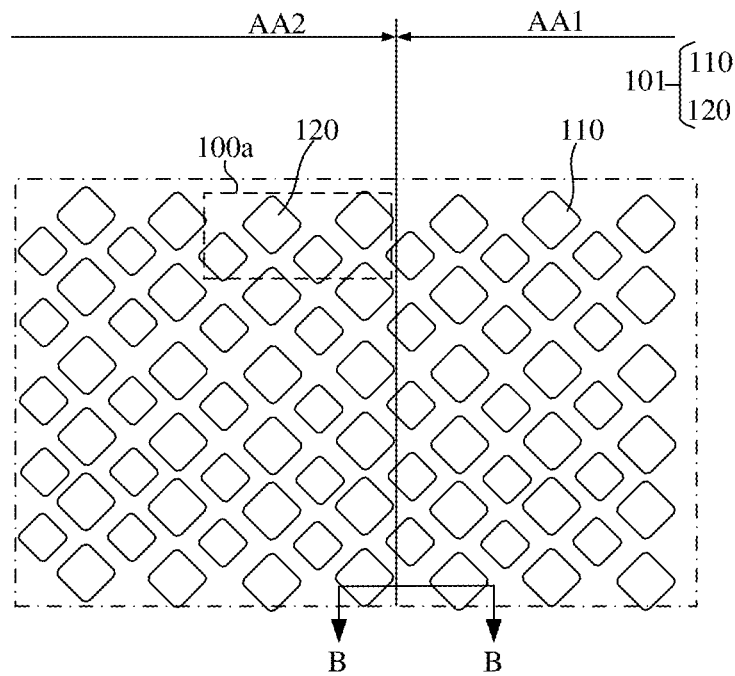
FIG. 2 shows a partially enlarged schematic diagram of the arrangement structure of sub-pixels 101 in area Q in FIG. 1.
Figure 3:
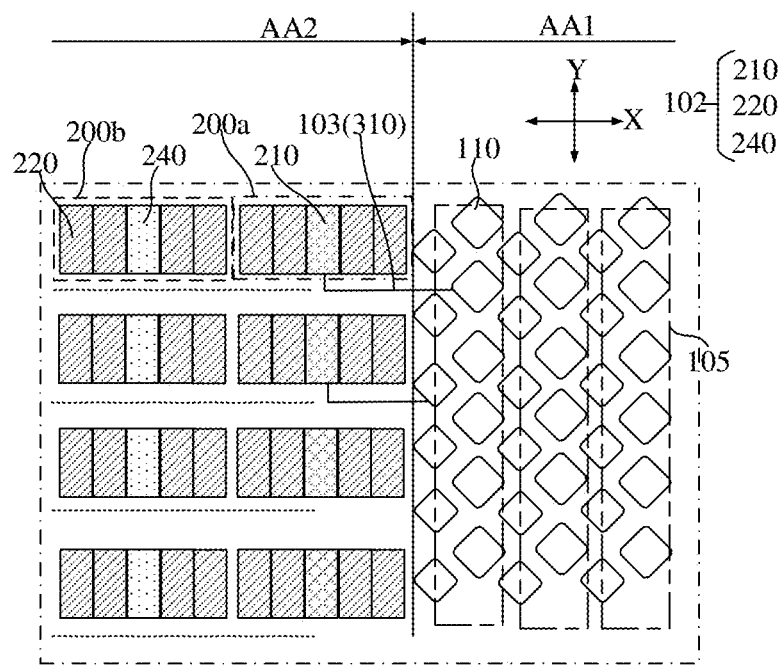
FIG. 3 shows a partially enlarged schematic diagram of a portion of pixel driving circuits in area Q in FIG. 1.

Reference is made to FIG. 1 to FIG. 3 together, in which FIG. 2 shows a partially enlarged schematic diagram of the arrangement structure of sub-pixels in area Q in FIG. 1, and FIG. 3 shows a partially enlarged schematic diagram of a portion of pixel driving circuits in area Q in FIG. 1.

As shown in FIG. 1 to FIG. 3, the display panel 100 according to the embodiments of the present application includes sub-pixels 101, shift registers 105, and pixel driving circuits 102. The sub-pixels 101 include first sub-pixels 110 located in the first display area AA1 and second sub-pixels 120 located in the second display area AA2; and the pixel driving circuits 102 are located in the second display area AA2 and include first circuits 210 configured to drive the first sub-pixels 110, second circuits 220 configured to drive the second sub-pixels 120, and dummy areas 240. A adjacent second sub-pixels 120 form a pixel block 100a, the first circuit 210 and α second circuits 220 form a first circuit block 200a, the α second circuits 220 in the first circuit block 200a are configured to drive the α second sub-pixels 220 in a same pixel block 100a, the dummy area 240 and α second circuits 220 form a second circuit block 200b, the α second circuits 220 in the second circuit block 200b are configured to drive the α second sub-pixels 120 in a same pixel block 100a, α is an integer greater than 1, and a relative positional relationship between the first circuit 210 and the second circuits 220 in the first circuit block 200a is the same as a relative positional relationship between the dummy area 240 and the second circuits 220 in the second circuit block 200b.

In order to better illustrate the connection relationship between the first circuits 210 and the first sub-pixels 110, the first sub-pixels 110 in the first display area AA1 are shown in FIG. 3, and only a portion of the pixel driving circuits 102 in the area Q are shown in FIG. 3.

The first circuit block 200a is illustrated in FIG. 3 by a dot dash box, and the first circuit 210 and the second circuit 220 located within a same dot dash box belong to a same first circuit block 200a, but the structure of the display panel 100 of the present application is not limited by the dot dash box. The second circuit block 200b is illustrated in FIG. 3 by a dashed box, and the dummy area 240 and the second circuit 220 located within a same dashed box belong to a same second circuit block 200b, but the structure of the display panel 100 of the present application is not limited by the dashed box.

The display panel 100 according to the embodiments of the first aspect of the present application includes the sub-pixels 101, the pixel driving circuits 102, and the shift registers 105. The sub-pixels 101 include the first sub-pixels 110 and the second sub-pixels 120, the first sub-pixels 110 and the shift registers 105 are all located in the first display area AA1. The pixel driving circuits 102 include the first circuits 210 configured to drive the first sub-pixels 110 and the second circuits 220 configured to drive the second sub-pixels 120, which are located in the second display area AA2. The shift registers 105 are located in the first display area AA1, and the first circuits 210 and the second circuits 220 are all located in the second display area AA2. That is, the pixel driving circuit 102 for driving the first sub-pixel 110 in the area where the shift register 105 is located is located in the second display area AA2, and space can be reserved for the shift register 105 by arranging the first circuit 210 in the first display area AA1, so as to reduce the frame width.

Optionally, by adding the dummy area 240 and making the relative positional relationship between the first circuit 210 and the second circuits 220 in the first circuit block 200a the same as the relative positional relationship between the dummy area 240 and the second circuits 220 in the second circuit block 200b, the layout and manufacturing of the pixel driving circuit 102 can be further simplified, and the display uniformity of the second display area AA2 can be further improved.

The first circuit 210 and α second circuits 220 form a first circuit block 200a, the a second circuits 220 in the first circuit block are configured to drive the α second sub-pixels in a same pixel block, and the first circuit 210 is configured to drive the first sub-pixel 110. A plurality of first circuit blocks 200a are arranged in an array in a column direction, in which a plurality of first circuits 210 are not co-linear. In this way, the relative position of the first circuit 210 in the first circuit block 200a is not fixed, which provides a better display uniformity.

Optionally, by arranging the dummy area 240, the arrangement of the second circuit block 200b may tend to be the same as the arrangement of the first circuit block 200a and the arrangement of a third circuit block 200c, so as to reduce the display difference and further improve the display uniformity of the second display area AA2.

Optionally, the number of the second circuit blocks 200b is two or more, and the relative position between each second circuit block 200b and the pixel block 100a driven by the second circuit block 200b is the same, so as to simplify the layout and manufacturing of the pixel driving circuit 102 and improve the display uniformity of the second display area AA2.

The pixel block 100a driven by the second circuit block 200b is the pixel block 100a where the α adjacent second sub-pixels 120 driven by the α second circuits 220 in the second circuit block 200b are located.

The relative position between each second circuit block 200b and the pixel block 100a driven by the second circuit block 200b being the same means that: for example, the display panel 100 includes a plurality of second circuit blocks 200b, each second circuit block 200b is staggered with the pixel block 100a driven by the second circuit block 200b along a thickness direction, and each second circuit block 200b is staggered with the pixel block 100a driven by the second circuit block 200b by the same size and along the same direction.

The relative position between each second circuit block 200b and the pixel block 100a driven by the second circuit block 200b being the same does not mean that the relative position between each second circuit block 200b and the pixel block 100a driven by the second circuit block 200b is strictly the same, provided that within the error range of the manufacturing process, the relative position between each second circuit block 200b and the pixel block 100a driven by the second circuit block 200b is substantially the same, so that the array base plate in which the second circuit block 200b is located can be directly connected with a light-emitting plate in which the second sub-pixel 120 is located in an overall alignment to enable the second circuit 220 to drive the second sub-pixel 120.

Optionally, along the thickness direction Z of the display panel, the size of the orthographic projection of the first circuit 210 is the same as the size of the dummy area 240, so that the display uniformity of the second display area AA2 can be further improved. For example, the first circuit 210 may be any of a 2T1C circuit, a 7T1C circuit, a 7T2C circuit, or a 9T1C circuit. Herein, the "2T1C circuit" refers to a pixel circuit including two thin film transistors (T) and one capacitor (C), and the same applies to the "7T1C circuit", "7T2C circuit", "9T1C circuit", and so on. Then the size of the orthographic projection of the first circuit 210 along the thickness direction Z is the sum of the sizes of the orthographic projections of the thin film transistors and the capacitors included in the first circuit 210 along the thickness direction Z.

Optionally, the display panel 100 includes a first conductive line extending along a first direction X and a second conductive line extending along a second direction Y. The first conductive line is, for example, a scanning line, a light emission control signal line, a voltage reference line, and the like. The second conductive line is, for example, a data signal line, a power line, and the like.

Assuming that two first circuits 210 are arranged adjacently along the second direction Y, in the two first circuits 210 arranged adjacently along the second direction Y, the distance between a first conductive line connected with the upper first circuit 210 and a first conductive line connected with the lower first circuit 210 may be a size L of the first circuit 210 along the second direction Y. For example, the distance between the center, along the second direction Y, of the first conductive line connected with the upper first circuit 210 and the center, along the second direction Y, of the first conductive line connected with the lower first circuit 210 may be the size L of the first circuit 210 along the second direction Y.

Assuming that two first circuits 210 are arranged adjacently along the first direction X, in the two first circuits 210 arranged adjacently along the first direction X, the distance between a second conductive line connected with the previous first circuit 210 and a second conductive line connected with the later first circuit 210 may be a size H of the first circuit 210 along the first direction X. For example, the distance between the center, along the first direction X, of the second conductive line connected with the previous first circuit 210 and the center, along the first direction X, of the second conductive line connected with the later first circuit 210 may be the size H of the first circuit 210 along the first direction X.

If the first circuit 210 and the second circuit 220 are arranged adjacently along the second direction Y, and the first circuit 210 is located between the first conductive line connected with the first circuit 210 and the first conductive line connected with the second circuit 220, then in the first circuit 210 and the second circuit 220 adjacent along the second direction Y, the distance between the center, along the second direction Y, of the first conductive line connected with the first circuit 210 and the center, along the second direction Y, of the first conductive line connected with the second circuit 220 may be the size L of the first circuit 210 along the second direction Y.

If the first circuit 210 and the second circuit 220 are arranged adjacently along the first direction X, and the first circuit 210 is located between the second conductive line connected with the first circuit 210 and the second conductive line connected with the second circuit 220, then in the first circuit 210 and the second circuit 220 adjacent along the first direction X, the distance between the second conductive line connected with the first circuit 210 and the second conductive line connected with the second circuit 220 may be the size H of the first circuit 210 along the first direction X.

Along the thickness direction Z of the display panel, the size of the orthographic projection of the first circuit 210 may be H*L.

Optionally, the size of the dummy area 240 may be H*L.

Optionally, the number of the first circuits 210 in the first circuit block 200a is the same as the number of the dummy areas 240 in the second circuit block 200b, so that the display effect of the dummy area 240 is the same as the display effect of the area where the first circuit 210 is located, and the display uniformity of the second display area AA2 can be further improved.

Optionally, along the thickness direction Z of the display panel, the size of the orthographic projection of the first circuit block 200a is the same as the size of the orthographic projection of the second circuit block 200b, so the size of the α second circuits 220 in the first circuit block 200a is the same as the size of the α second circuits 220 in the second circuit block 200b, so that the display uniformity of the second display area AA2 can be further improved.

The size of the orthographic projection of the first circuit block 200a is the sum of the sizes of the orthographic projections of the first circuit 210 and the α second circuits 220 in the first circuit block 200a. The size of the orthographic projection of the second circuit block 200b is the sum of the sizes of the orthographic projections of the dummy area 240 and the a second circuits 220 in the second circuit block 200b.

If the first circuit 210 and the second circuit 220 are arranged adjacently along the second direction Y, and the second circuit 220 is located between the first conductive line connected with the first circuit 210 and the first conductive line connected with the second circuit 220, then in the first circuit 210 and the second circuit 220 adjacent along the second direction Y, the distance between the center, along the second direction Y, of the first conductive line connected with the first circuit 210 and the center, along the second direction Y, of the first conductive line connected with the second circuit 220 may be a size L' of the second circuit 220 along the second direction Y.

If the first circuit 210 and the second circuit 220 are arranged adjacently along the first direction X, and the second circuit 220 is located between the second conductive line connected with the first circuit 210 and the second conductive line connected with the second circuit 220, then in the first circuit 210 and the second circuit 220 adjacent along the first direction X, the distance between the second conductive line connected with the first circuit 210 and the second conductive line connected with the second circuit 220 may be a size H' of the second circuit 220 along the first direction X.

Along the thickness direction Z of the display panel, the size of the orthographic projection of the second circuit 220 is L'*H'.

Optionally, a dummy circuit is arranged in the dummy area 240, and the structure of the dummy circuit is the same as the structure of the first circuit 210, so that the display effect of the dummy area 240 is the same as the display effect of the area where the first circuit 210 is located, and the display uniformity of the second display area AA2 can be further improved.

Optionally, the number of the first circuit blocks 200a is two or more, and the relative position between each first circuit block 200a and the pixel block 100a driven by the first circuit block 200a is the same. The pixel block 100a driven by the first circuit block 200a is the pixel block 100a where the α adjacent second sub-pixels 120 driven by the α second circuits 220 in the first circuit block 200a are located.

The relative position between each first circuit block 200a and the pixel block 100a driven by the first circuit block 200a being the same means that: for example, the display panel 100 includes a plurality of first circuit blocks 200a, each first circuit block 200a is staggered with the pixel block 100a driven by the first circuit block 200a along the thickness direction, and each first circuit block 200a is staggered with the pixel block 100a driven by the first circuit block 200a by the same size and along the same direction.

The relative position between each first circuit block 200a and the pixel block 100a driven by the first circuit block 200a being the same does not mean that the relative position between each first circuit block 200a and the pixel block 100a driven by the first circuit block 200a is strictly the same, provided that within the error range of the manufacturing process, the relative position between each first circuit block 200a and the pixel block 100a driven by the first circuit block 200a is substantially the same, so that the array base plate in which the first circuit block 200a is located can be directly connected with a light-emitting plate in which the second sub-pixel 120 is located in an overall alignment to enable the second circuit 220 to drive the second sub-pixel 120.

In these optional embodiments, the relative position between each first circuit block 200a and the pixel block 100a driven by the first circuit block 200a is the same, so as to simplify the layout and manufacturing of the pixel driving circuit 102 and improve the display uniformity of the second display area AA2, and the effect on the connection between the second circuit 220 and the second sub-pixel 120 due to arranging the first circuit 210 in the second display area AA2 is reduced.

Figure 4:
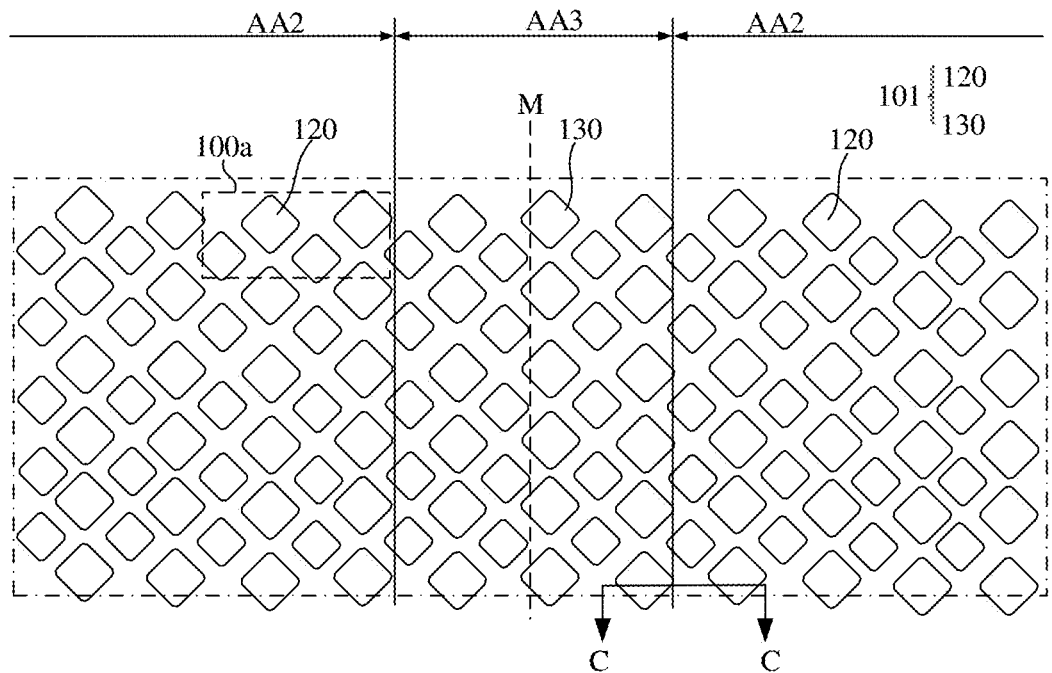
FIG. 4 shows a partially enlarged schematic diagram of arrangement structure of sub-pixels 101 in area Q' in FIG. 1.
Figure 5:
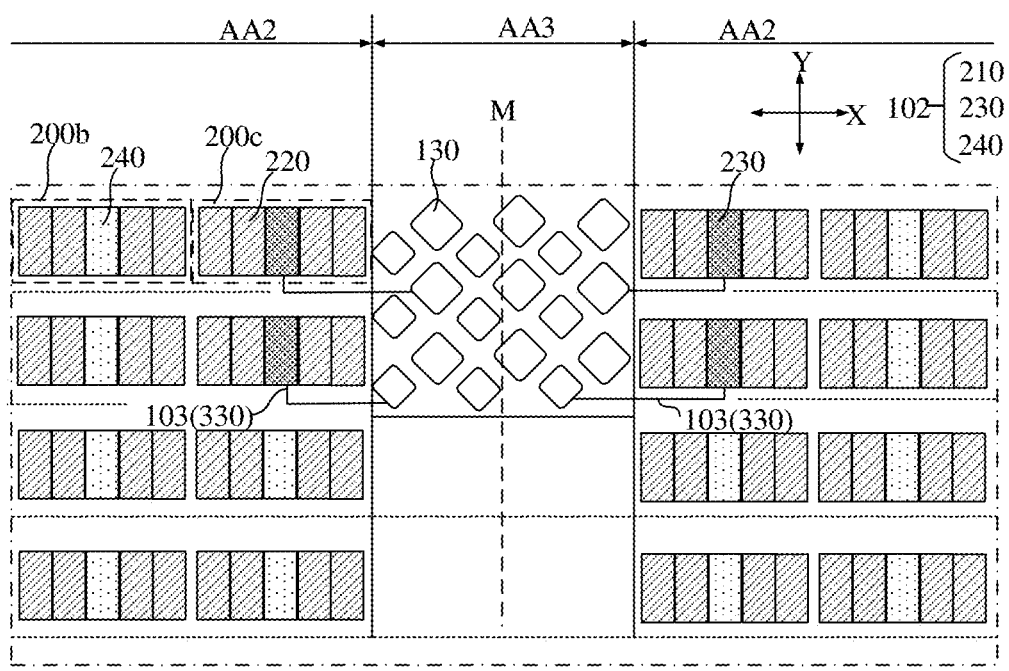
FIG. 5 shows a partially enlarged schematic diagram of a portion of pixel driving circuits in area Q' in FIG. 1.

Reference is made to FIGS. 1 and 4-5 together, in which FIG. 4 shows a partially enlarged schematic diagram of arrangement structure of sub-pixels in area Q' in FIG. 1, and FIG. shows a partially enlarged schematic diagram of a portion of pixel driving circuits in area Q' in FIG. 1.

In some optional embodiments, as shown in FIGS. 1 and 4-5, the display panel 100 further includes a third display area AA3, the second display area AA2 is arranged around at least a portion of the third display area AA3; the sub-pixels 101 further include third sub-pixels 130 located in the third display area AA3; and the pixel driving circuits 102 further include third circuits 230 configured to drive the third sub-pixels 130. The pixel driving circuits 102 for driving the sub-pixels 101 in the third display area AA3 are located in the second display area AA2, and the light transmittance of the third display area AA3 can be increased, so that the photosensitive component 200 can acquire light information through the third display area AA3, which is beneficial for the under-screen integration of the photosensitive component 200.

The third circuit 230 and α second circuits 220 form a third circuit block 200c, the α second circuits 220 in the third circuit block 200c are configured to drive the α second sub-pixels 120 in a same pixel block 100a, a is an integer greater than 1, and a relative position between each third circuit block 200c and the pixel block 100a driven by the third circuit block 200c is the same, so as to simplify the layout and manufacturing of the pixel driving circuit 102 and improve the display uniformity of the second display area AA2.

The pixel block 100a driven by the third circuit block 200c is the pixel block 100a where the α adjacent second sub-pixels 120 driven by the α second circuits 220 in the third circuit block 200c are located.

In order to better illustrate the connection relationship between the third circuits 230 and the third sub-pixels 130, the third sub-pixels 130 in the third display area AA3 are shown in FIG. 5, and only a portion of the pixel driving circuits 102 in the area Q' are shown in FIG. 5.

The third circuit block 200c is illustrated in FIG. 5 by a dot dash box, and the third circuit 230 and the second circuit 220 located within a same dot dash box belong to a same third circuit block 200c, but the structure of the display panel 100 of the present application is not limited by the dot dash box.

Optionally, along the thickness direction Z of the display panel, the size of the orthographic projection of the first circuit 210 is the same as the size of the orthographic projection of the third circuit 230, so that the display uniformity of the second display area AA2 can be further improved. The definition of the size of the third circuit 230 is the same as the definition of the size of the first circuit 210, which will not be repeated herein.

Optionally, the number of the first circuits 210 in the first circuit block 200a is the same as the number of the third circuits 230 in the third circuit block 200c, so that the display effect of the area where the first circuit 210 is located is much closer to the display effect of the area where the third circuit 230 is located, and the display uniformity of the second display area AA2 can be further improved.

Optionally, along the thickness direction Z of the display panel, the size of the orthographic projection of the first circuit block 200a is the same as the size of the orthographic projection of the third circuit block 200c, so the size of the α second circuits 220 in the first circuit block 200a is the same as the size of the α second circuits 220 in the third circuit block 200c, so that the display uniformity of the second display area AA2 can be further improved.

Optionally, the relative positional relationship between the first circuit 210 and the second circuits 220 in the first circuit block 200a the same as the relative positional relationship between the third circuit 230 and the second circuits 220 in the third circuit block 200c, the layout and manufacturing of the pixel driving circuit 102 can be further simplified, and the display uniformity of the second display area AA2 can be further improved.

In some optional embodiments, as shown in FIGS. 3 and 5, the display panel 100 further includes connection lines 103 including first connection lines 310 for connecting the first sub-pixels 110 with the first circuits 210 and third connection lines 330 for connecting the third sub-pixels 130 with the third circuits 230, and at least a portion of the first connection line 310 and at least a portion of the third connection line 330 are located in a same film layer.

In these optional embodiments, at least a portion of the first connection line 310 and at least a portion of the third connection line 330 are located in a same film layer, so that at least the portion of the first connection line 310 and at least the portion of the third connection line 330 can be manufactured simultaneously, with no need for addition of process for manufacturing the portion of the first connection line 310 and the portion of the third connection line 330, and thus no increase of the number and processing of the mask plates. Accordingly, the manufacturing process of the display panel 100 can be simplified and the manufacturing efficiency of the display panel 100 can be improved, and further the thickness of the display panel 100 can be reduced.

Optionally, the connection lines 103 further include second connection lines 320 for connecting the second sub-pixels 120 with the second circuits 220.

Figure 6:
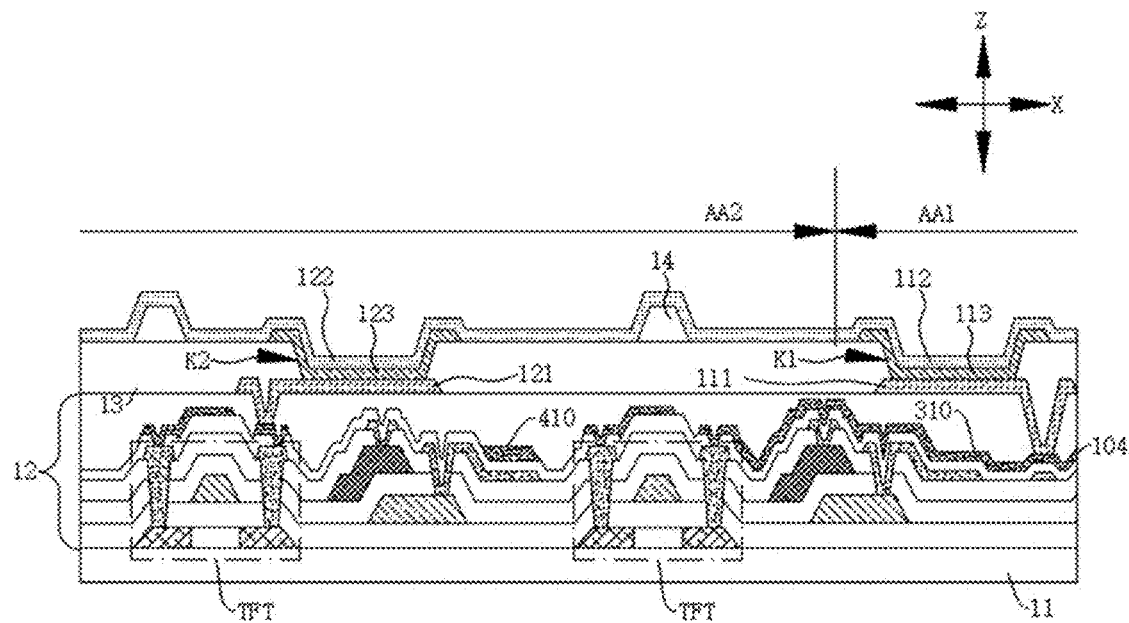
FIG. 6 shows a sectional view at B-B in FIG. 2.
Figure 7:
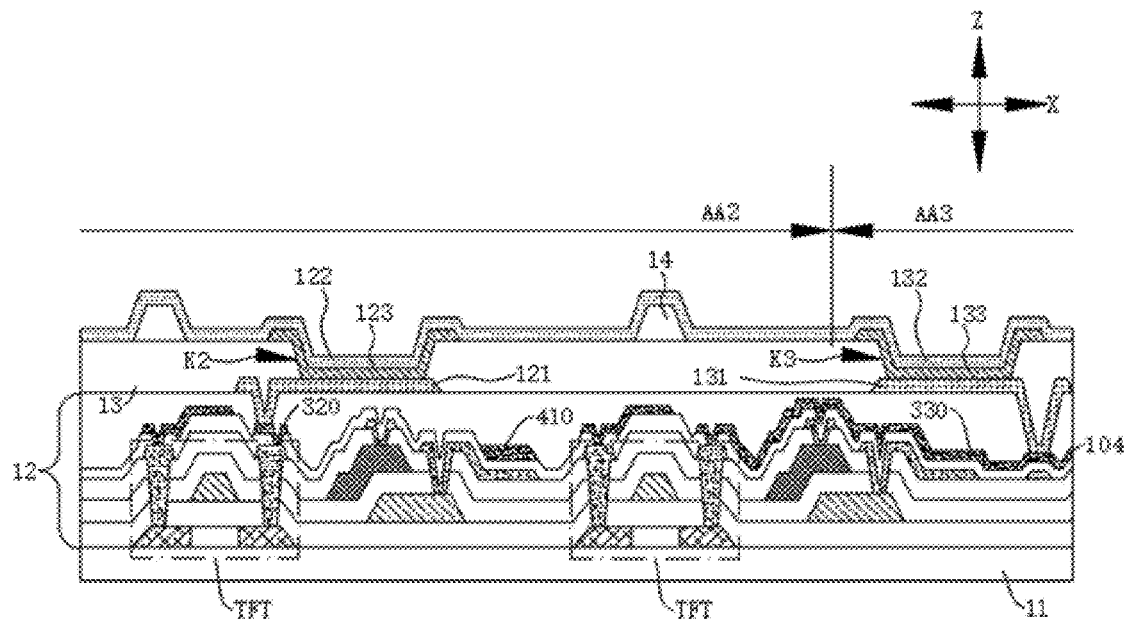
FIG. 7 shows a sectional view at C-C in FIG. 4.

Reference is made to FIGS. 3 and 5-7 together, in which FIG. 6 shows a sectional view at B-B in FIG. 2, and FIG. 7 shows a sectional view at C-C in FIG. 4.

In some optional embodiments, as shown in FIGS. 3 and 5-7, the display panel 100 further includes a signal line layer 104 including a signal line 410, at least a portion of the connection line 103 is located in the signal line layer 104, and the signal line 410 includes at least one of a data line, a scanning line, a power line, a voltage reference line, and a ground line. Therefore, the portion of the connection line 103 can be manufactured simultaneously with at least one of the data line, the scanning line, the power line, the voltage reference line and the ground line, with no need for addition of process for manufacturing the portion of the connection line 103, and thus no increase of the number and processing of the mask plates. Accordingly, the manufacturing process of the display panel 100 can be simplified and the manufacturing efficiency of the display panel 100 can be improved, and further the thickness of the display panel 100 can be reduced.

Optionally, the orthographic projection of at least a portion of the connection line 103 along the thickness direction Z of the display panel is staggered with the orthographic projection of the pixel driving circuit 102 along the thickness direction Z of the display panel, so that the overlapping area between the portion of the connection line 103 and the pixel driving circuit 102 can be reduced, and the effect on signal transmission due to the parasitic capacitance between the connection line 103 and the pixel driving circuit 102 can be reduced.

Optionally, at least a portion of the first connection line 310 extends along the first direction X and is located at a side, along the second direction Y, of the first circuit block 200a corresponding to the first connection line 310; and/or at least a portion of the third connection line 330 extends along the first direction X and is located at a side, along the second direction Y, of the third circuit block 200c corresponding to the third connection line 330, and the first direction X and the second direction Y intersect.

In these optional embodiments, if a portion of the first connection line 310 is manufactured along the first direction X and the portion of the first connection line 310 manufactured along the first direction X is located at a side, along the second direction Y, of the first circuit block 200a corresponding to the first connection line 310, on the one hand, the first connection line 310 is located in the reserved space between the first circuits 210, and on the other hand, the overlapping area between the first connection line 310 and the first circuit 210 can be reduced, so as to reduce the interaction between the first connection line 310 and the first circuit 210.

If a portion of the third connection line 330 is manufactured along the first direction X and the portion of the third connection line 330 manufactured along the first direction X is located at a side, along the second direction Y, of the third circuit block 200c corresponding to the third connection line 330, on the one hand, the third connection line 330 is located in the reserved space between the third circuits 230, and on the other hand, the overlapping area between the third connection line 330 and the third circuit 230 can be reduced, so as to reduce the interaction between the third connection line 330 and the third circuit 230.

The first circuit block 200a corresponding to the first connection line 310 is the first circuit block 200a where the first circuit 210 connected with the first connection line 310 is located, and the third circuit block 200c corresponding to the third connection line 330 is the third circuit block 200c where the third circuit 230 connected with the third connection line 330 is located.

Still referring to FIG. 6 and FIG. 7, the display panel 100 may further include a substrate 11, an array base plate layer 12 arranged on the substrate, and a pixel definition layer 13. The pixel driving circuits 102 may be arranged in the array base plate layer 12. The first circuit 210, the second circuit 220, and the third circuit 230 may each include a thin film transistor (TFT). The array base plate layer 12 may further include structures such as a capacitor. The pixel definition layer 13 includes pixel openings including first pixel openings K1 located in the first display area AA1, second pixel openings K2 located in the second display area AA2, and third pixel openings K3 located in the third display area AA3. The first sub-pixel 110 includes a first electrode 111, a second electrode 112, and a first light-emitting structure 113 located between the first electrode 111 and the second electrode 112, and the first light-emitting structure 113 is located in the first pixel opening K1. The first electrode 111 is connected with the TFT of the first circuit 210 through the first connection line 310. The second sub-pixel 120 includes a third electrode 121, a fourth electrode 122, and a second light-emitting structure 123 located between the third electrode 121 and the fourth electrode 122, and the second light-emitting structure 123 is located in the second pixel opening K2. The third sub-pixel 130 includes a fifth electrode 131, a sixth electrode 132, and a third light-emitting structure 133 located between the fifth electrode 131 and the sixth electrode 132, and the third light-emitting structure 133 is located in the third pixel opening K3. The fifth electrode 131 is connected with the TFT of the third circuit 230 through the third connection line 330. Support pillars 14 may be further arranged on the pixel definition layer 13. The first electrode 111, the third electrode 121 and the fifth electrode 131 may be pixel electrodes, and the second electrode 112, the fourth electrode 122 and the sixth electrode 132 may be interconnected as a whole face electrode.

Figure 8:
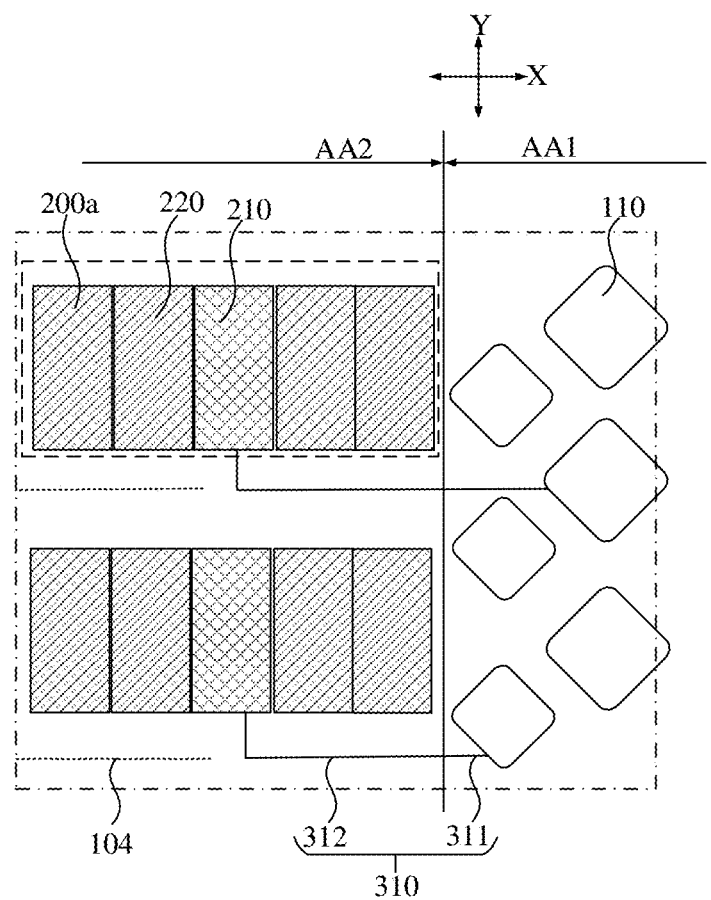
FIG. 8 shows a partially enlarged schematic structural diagram of FIG. 3.
Figure 9:
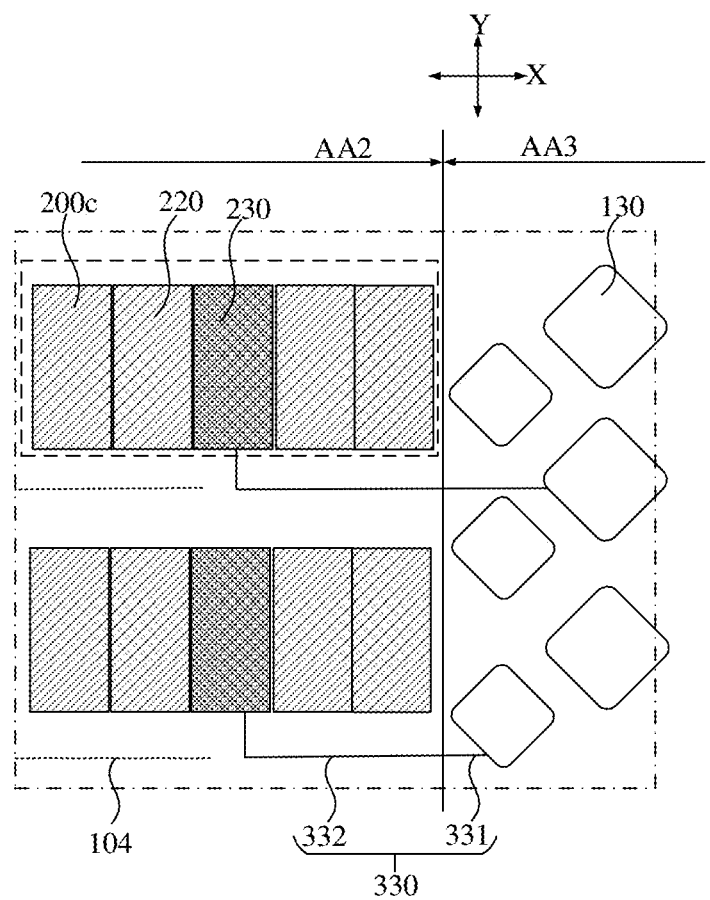
FIG. 9 shows a partially enlarged schematic structural diagram of FIG. 5.

Reference is made to FIGS. 6-9 together, in which FIG. 8 shows a partially enlarged schematic structural diagram of FIG. 3, and FIG. 9 shows a partially enlarged schematic structural diagram of FIG. 5.

As shown in FIGS. 6 and 8, in some optional embodiments, the first connection line 310 includes a first segment 311 located in the first display area AA1 and a second segment 312 located in the second display area AA2, and the second segment 312 is located in the signal line layer 104. Therefore, the first connection line 310 can be manufactured simultaneously with the signal line, with no need for addition of process for manufacturing the first connection line 310, and thus no increase of the number and processing of the mask plates. Accordingly, the manufacturing process of the display panel 100 can be simplified and the manufacturing efficiency of the display panel 100 can be improved, and further the thickness of the display panel 100 can be reduced.

Optionally, the first segment 311 and the second segment 312 are located in different film layers, so as to reduce the risk of short circuit between different first connection lines 310. As shown in FIGS. 7 and 9, in some optional embodiments, the third connection line 330 includes a third segment 331 located in the third display area AA3 and a fourth segment 332 located in the second display area AA2, and the fourth segment 332 is located in the signal line layer 104. Therefore, the fourth segment 332 can be manufactured simultaneously with the signal line 410, with no need for addition of process for manufacturing the fourth segment 332, and thus no increase of the number and processing of the mask plates. Accordingly, the manufacturing process of the display panel 100 can be simplified and the manufacturing efficiency of the display panel 100 can be improved, and further the thickness of the display panel 100 can be reduced. Optionally, the fourth segment 332 and the third segment 331 are located in different film layers, so as to reduce the risk of short circuit between different third connection lines 330.

Optionally, the third segment 331 may be manufactured with a light-transmitting material, for example, indium tin oxide, so as to increase the light transmittance of the first display area AA1.

Optionally, the first segment 311 and the third segment 331 are located in a same film layer, so that the first segment 311 can be manufactured simultaneously with the third segment 331. Accordingly, the manufacturing process of the display panel 100 can be simplified and the manufacturing efficiency of the display panel 100 can be improved, and further the thickness of the display panel 100 can be reduced.

In some optional embodiments, the connection lines 103 connected with the sub-pixels 101 of a same color are manufactured using a same material.

In these optional embodiments, the connection lines 103 made of a same material are used for the sub-pixels 101 of a same color, so that the pixel brightness difference due to the resistance difference of the connection lines 103 can be reduced, and the display uniformity of the second display area AA2 can be further improved.

Optionally, the second display area AA2 includes a main display area, a first transition area located between the main display area and the first display area AA1, and a second transition area located between the main display area and the third display area AA3. The first circuit 210 is located in the first transition area, so that the spacing between the first circuit 210 and the first display area AA1 is small, and the wiring length between the first circuit 210 and the first sub-pixel 110 can be reduced; the third circuit 230 is located in the second transition area, so that the spacing between the third circuit 230 and the third display area AA3 is small, and the wiring length between the third circuit 230 and the third sub-pixel 130 can be reduced; and the dummy area 240 is located in the main display area, the display uniformity of the second display area AA2 can be further improved.

In some optional embodiments, the first sub-pixels 110, the second sub-pixels 120, and the third sub-pixels 130 are distributed in rows and columns, and the first circuits 210, the second circuits 220, and the third circuits 230 are distributed in rows and columns, in which at least a portion of the first circuits 210 and the second circuits 220 are arranged in a same row, and the first circuits 210 and the second circuits 220 arranged in a same row are configured to drive the first sub-pixels 110 and the second sub-pixels 120 located in a same row; and/or at least a portion of the third circuits 230 and the second circuits 220 are arranged in a same row, and the third circuits 230 and the second circuits 220 arranged in a same row are configured to drive the third sub-pixels 130 and the second sub-pixels 120 located in a same row.

In these optional embodiments, the first circuits 210 are connected with the first sub-pixels 110 through the first connection lines 310, the second circuits 220 are connected with the second sub-pixels 120 through the second connection lines 320, and the third circuits 230 are connected with the third sub-pixels 130 through the third connection lines 330. If the first circuits 210, the second circuits 220, and the third circuits 230 in a same row are arranged in the same row as the first sub-pixels 110, the second sub-pixels 120, and the third sub-pixels 130 driven by the first circuits 210, the second circuits 220, and the third circuits 230, the shape of the scanning line can be simplified, thereby facilitating the scanning line to drive the first sub-pixels 110, the second sub-pixels 120, and the third sub-pixels 130 in a same row, and improving the signal transmission stability.

In some optional embodiments, the third display area AA3 is arranged symmetrically with respect to a first symmetry axis M that extends along the second direction Y and passes through the center of the third display area AA3, a plurality of first circuits 210 are distributed symmetrically with respect to the first symmetry axis M, and the first circuit 210 and the first sub-pixel 110 driven by the first circuit 210 are located at a same side of the first symmetry axis M, so as to further reduce the distance between the first circuit 210 and the first sub-pixel 110 driven by the first circuit 210, and reduce the wiring distance; and a plurality of third circuits 230 are distributed symmetrically with respect to the first symmetry axis M, and the third circuit 230 and the third sub-pixel 130 driven by the third circuit 230 are located at a same side of the first symmetry axis M, so as to further reduce the distance between the third circuit 230 and the third sub-pixel 130 driven by the third circuit 230, and reduce the wiring distance.

Figure 10:
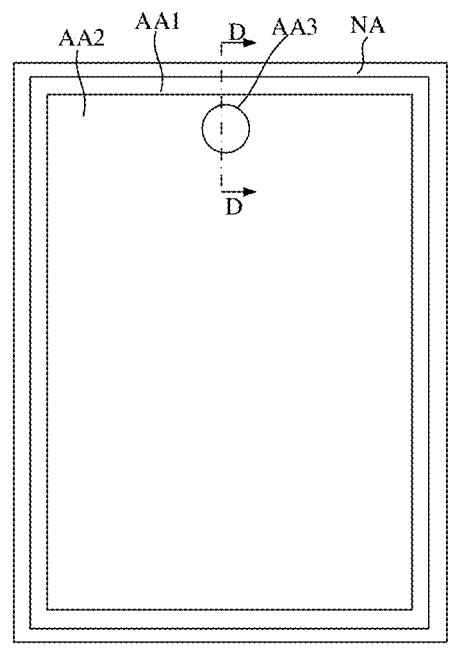
FIG. 10 shows a schematic structural diagram of a display apparatus according to the embodiments of the present application.
Figure 11:
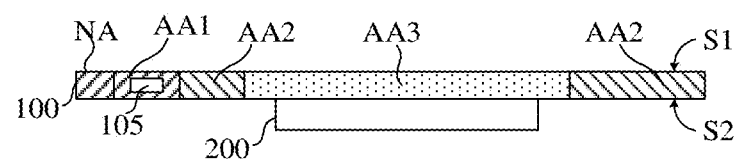
FIG. 11 shows a sectional view at D-D in FIG. 10.

Reference is made to FIG. 10 and FIG. 11, in which FIG. 10 shows a schematic structural diagram of a display apparatus according to the embodiments of the present application, and FIG. 11 shows a sectional view at D-D in FIG. 10.

The display apparatus according to the embodiments of the second aspect of the present application may include the display panel 100 according to any of the above implementations. In the display apparatus according to the embodiments, the display panel 100 may be the display panel 100 according to one of the above embodiments which includes the first display area AA1, the second display area AA2, and the third display area AA3, and the light transmittance of the third display area AA3 is greater than the light transmittance of the second display area AA2.

In the display panel 100 of the display apparatus, referring to FIGS. 2, 3, and 11 together, the first circuit 210 for driving the first sub-pixel 110 in the first display area AA1 is arranged in the second display area AA2, sufficient space can be saved for arranging the shift register 105, so that the shift register 105, which is originally located in the non-display area, can be arranged in the first display area AA1 which is capable of displaying image, and thus the width of the frame of the display apparatus can be reduced.

Optionally, as shown in FIG. 11, the display panel 100 includes a first surface S1 and a second surface S2 opposite to each other, and the first surface S1 is the display surface. The display apparatus further includes the photosensitive component 200 located at a side of the display panel 100 corresponding to the second surface S2, and the photosensitive component 200 corresponds to the position of the third display area AA3.

The photosensitive component 200 may be an image capturing component for capturing external image information. In the embodiments, the photosensitive component 200 is a complementary metal oxide semiconductor (CMOS) image capturing component. In some other embodiments, the photosensitive component 200 may be other image capturing component such as a charge-coupled device (CCD) image capturing component. It should be understood that the photosensitive component 200 may not be limited to an image capturing component, and for example, in some embodiments, the photosensitive component 200 may be a light sensor such as an infrared sensor, a proximity sensor, an infrared lens, a flood sensing element, an ambient light sensor, and a dot matrix projector. In addition, other components may be integrated at the side of the display panel 100 of the display apparatus corresponding to the second surface S2, such as a telephone receiver or a speaker.

In the display apparatus according to the embodiments of the present application, the light transmittance of the third display area AA3 is greater than the light transmittance of the second display area AA2, so that the photosensitive component 200 can be integrated at the back of the third display area AA3 of the display panel 100 to achieve under-screen integration for the photosensitive component 200 such as an image capturing component, while the third display area AA3 can display image, the display area of the display panel 100 is increased, and a full-screen design is achieved for the display apparatus. The first sub-pixel 110 is located in the first display area AA1, so that the frame area of the display panel 100 can emit light and display image, thereby reducing the frame of the display panel 100 and achieve a narrow frame design for the display apparatus.

The above embodiments of the present application do not exhaustively describe all the details, nor do they limit the present application to the specific embodiments as described. Obviously, according to the above description, many modifications and changes can be made. These embodiments are selected and particularly described in the specification to better explain the principles and practical applications of the present application, so that a person skilled in the art is able to utilize the present application and make modifications based on the present application. The present application is limited only by the claims and the full scope and equivalents of the claims.

What is claimed is:

1. A display panel comprising a first display area and a second display area, the display panel comprising:
   sub-pixels comprising first sub-pixels located in the first display area and second sub-pixels located in the second display area;
   one or more shift registers located in the first display area; and
   pixel driving circuits located in the second display area and comprising first circuits configured to drive the first sub-pixels, second circuits configured to drive the second sub-pixels, and dummy areas,
   wherein α adjacent second sub-pixels form a pixel block, the first circuit and α second circuits form a first circuit block, the α second circuits in the first circuit block are configured to drive the α second sub-pixels in a same pixel block, the dummy area and α second circuits form a second circuit block, the α second circuits in the second circuit block are configured to drive the α second sub-pixels in a same pixel block, α is an integer greater than 1, and a relative positional relationship between the first circuit and the second circuits in the first circuit block is the same as a relative positional relationship between the dummy area and the second circuits in the second circuit block.

2. The display panel of claim 1, wherein along a thickness direction of the display panel, a size of an orthographic projection of the first circuit is the same as a size of the dummy area.

3. The display panel of claim 1, wherein the display panel comprises a plurality of second circuit blocks, and a relative position between each second circuit block and the pixel block driven by the second circuit block is the same.

4. The display panel of claim 1, wherein a number of the first circuits in the first circuit block is the same as a number of the dummy areas in the second circuit block.

5. The display panel of claim 1, wherein along a thickness direction of the display panel, a size of an orthographic projection of the first circuit block is the same as a size of an orthographic projection of the second circuit block.

6. The display panel of claim 1, wherein a dummy circuit is arranged in the dummy area, and a structure of the dummy circuit is the same as a structure of the first circuit.

7. The display panel of claim 1, wherein the display panel further comprises a third display area, the second display area is arranged around at least a portion of the third display area;
the sub-pixels further comprise third sub-pixels located in the third display area; and
the pixel driving circuits further comprise third circuits configured to drive the third sub-pixels,
wherein the third circuit and α second circuits form a third circuit block, the α second circuits in the third circuit block are configured to drive the α second sub-pixels in a same pixel block, a is an integer greater than 1, and a relative position between each third circuit block and the pixel block driven by the third circuit block is the same.

8. The display panel of claim 7, wherein along a thickness direction of the display panel, a size of an orthographic projection of the first circuit is the same as a size of an orthographic projection of the third circuit;
a number of the first circuits in the first circuit block is the same as a number of the third circuits in the third circuit block; and
along the thickness direction of the display panel, a size of an orthographic projection of the first circuit block is the same as a size of an orthographic projection of the third circuit block.

9. The display panel of claim 7, wherein a relative positional relationship between the first circuit and the second circuits in the first circuit block is the same as a relative positional relationship between the third circuit and the second circuits in the third circuit block.

10. The display panel of claim 7, wherein the display panel further comprises connection lines comprising first connection lines for connecting the first sub-pixels with the first circuits and third connection lines for connecting the third sub-pixels with the third circuits, and at least a portion of the first connection line and at least a portion of the third connection line are located in a same film layer.

11. The display panel of claim 10, wherein the display panel further comprises:
a signal line layer comprising a signal line, at least a portion of the connection line being located in the signal line layer, and the signal line comprising at least one of a data line, a scanning line, a power line, a voltage reference line, and a ground line.

12. The display panel of claim 10, wherein an orthographic projection of at least a portion of the connection line along a thickness direction of the display panel is staggered with an orthographic projection of the pixel driving circuit along the thickness direction of the display panel.

13. The display panel of claim 10, wherein at least a portion of the first connection line extends along a first direction and is located at at least one side, along a second direction, of the first circuit block corresponding to the first connection line; and/or
at least a portion of the third connection line extends along the first direction and is located at at least one side, along the second direction, of the third circuit block corresponding to the third connection line, and the first direction and the second direction intersect.

14. The display panel of claim 11, wherein the first connection line comprises a first segment located in the first display area and a second segment located in the second display area, and the second segment is located in the signal line layer; and
the first segment and the second segment are located in different film layers.

15. The display panel of claim 14, wherein the third connection line comprises a third segment located in the third display area and a fourth segment located in the second display area, and the fourth segment is located in the signal line layer; and
the fourth segment and the third segment are located in different film layers.

16. The display panel of claim 15, wherein the first segment and the third segment are located in a same film layer.

17. The display panel of claim 10, wherein the connection lines connected with the sub-pixels of a same color are manufactured using a same material.

18. The display panel of claim 1, wherein the display panel comprises a plurality of first circuit blocks, and a relative position between each first circuit block and the pixel block driven by the first circuit block is the same.

19. The display panel of claim 7, wherein the first sub-pixels, the second sub-pixels, and the third sub-pixels are distributed in rows and columns, and the first circuits, the second circuits, and the third circuits are distributed in rows and columns,
wherein at least a portion of the first circuits and the second circuits are arranged in a same row, and the first circuits and the second circuits arranged in a same row are configured to drive the first sub-pixels and the second sub-pixels located in a same row; and/or
at least a portion of the third circuits and the second circuits are arranged in a same row, and the third circuits and the second circuits arranged in a same row are configured to drive the third sub-pixels and the second sub-pixels located in a same row.

20. A display apparatus comprising the display panel according to claim 1.

* * * * *